United States Patent [19]

Switky

[11] Patent Number: 5,413,489
[45] Date of Patent: May 9, 1995

[54] INTEGRATED SOCKET AND IC PACKAGE ASSEMBLY

[75] Inventor: Andrew Switky, Palo Alto, Calif.

[73] Assignee: Aptix Corporation, San Jose, Calif.

[21] Appl. No.: 53,610

[22] Filed: Apr. 27, 1993

[51] Int. Cl.⁶ .............................................. H01R 23/72
[52] U.S. Cl. ..................................... 439/71; 174/52.4
[58] Field of Search ................................... 439/68-73, 439/525, 526, 66, 331; 174/52.4

[56] References Cited

U.S. PATENT DOCUMENTS

| | | | |
|---|---|---|---|
| 4,008,300 | 2/1977 | Ponn | 264/104 |
| 4,558,397 | 12/1985 | Olsson | 439/69 |
| 4,652,970 | 3/1987 | Watari et al. | 361/385 |
| 4,692,790 | 9/1987 | Oyamada | 357/79 |
| 4,770,641 | 9/1988 | Rowlette | 439/86 |
| 4,832,612 | 5/1989 | Grabbe et al. | 439/331 |
| 4,885,126 | 12/1989 | Polonio | 174/52.4 |
| 4,954,878 | 9/1990 | Fox et al. | 357/81 |
| 5,053,851 | 10/1991 | Berndlmaier et al. | 357/68 |
| 5,067,007 | 11/1991 | Kanji et al. | 357/74 |
| 5,068,714 | 11/1991 | Seipler | 357/80 |
| 5,127,837 | 7/1992 | Shah et al. | 439/71 |
| 5,254,016 | 10/1993 | Ganthier | 439/78 |

*Primary Examiner*—Neil Abrams
*Attorney, Agent, or Firm*—D'Alessandro & Ritchie

[57] ABSTRACT

An integrated circuit package for demountable attachment to a printed circuit board or like device is formed from an integrated assembly of an IC chip and socket, The IC chip is permanently mounted to a chip carrier which spreads the contact area from a first area to a larger second area. The chip carrier or spreader is contained in a plastic socket formed of a cover and a base. The base has an array of apertures therethrough each of which is equipped with wadded wire/plunger contacts for conformal contact with both pads on the bottom of the chip carrier and pads on a circuit board.

8 Claims, 3 Drawing Sheets

INTEGRATED SOCKET AND IC PACKAGE ASSEMBLY

RELATED APPLICATIONS

The disclosure of co-pending patent application Ser. No. 08/053,505 filed Apr. 27, 1993 and entitled "Integrated Circuit Package With Direct Access to Internal Signals" is hereby incorporated herein by reference.

BACKGROUND OF THE INVENTION

1. Field of the Invention

The present invention relates to integrated circuit packages. More particularly, the present invention relates to a method and apparatus for socketing semiconductor devices and attaching semiconductor sockets to printed circuit boards and similar structures.

2. The Prior Art

The package for an integrated circuit ("IC") semiconductor device typically fulfills three functions. It provides environmental and physical protection for the silicon chip, it provides a means to facilitate handling of the chip, and it provides electrical connection from the chip to the system in which it is installed. Packages are usually soldered to their circuit boards to physically and electrically connect the package to the circuit board.

An additional level of packaging—a socket—is sometimes used to electrically and physically connect the IC package to its printed circuit board. Sockets for IC packages are usually fitted with pins which are soldered to a circuit board; pressure contacts can also be used, in which case the socket is pushed against the circuit board with screws, springs, or some other type of mounting hardware. In the latter configuration pressure contacts must have enough compliance or conformance to compensate for non-planarities present in the circuit board and/or the mounting surface of the IC package.

With the increasing cost and complexity of some integrated circuits and the high penalties often associated with equipment down-time, there is an increasing need for component repairability and an ability to change system functionality with little or no impact on the rest of the system. It is well understood that determination of a defect's cause is made easier by minimizing perturbations of the defective system. Removing a device from its conventional socket may cause changes in the socket/IC package system which will prevent adequate failure analysis. While allowing the removal and replacement of components, neither type of socket described above can be removed from a circuit board easily. Thus, a defective part can be easily replaced, but not a defective socket. Also, the time it takes to determine the cause of a failure—whether in the device itself or in the socket—may result in an unacceptable amount of down-time.

There are numerous examples of the first type of socket described above sold to various standard through-hole and surface mount footprints by a variety of vendors. Nepenthe Distribution, Inc. (U.S.A.) of Palo Alto, Cal., for example, sells sockets for various pin grid arrays and quad flatpacks such as the 225-pin PGA socket (Part Number NEPS-225-RS15) and the 68-pin PLCC socket (Part Number 1-068-0000). Both of these are intended to be soldered to a circuit board. U.S. Pat. No. 5,176,524 to Iseki et al. entitled "IC Socket Structure" teaches the use of sockets for surface mount devices ("SMDs") that are themselves surface mountable. These are also intended for soldering to a printed circuit board.

Due to the fact that both through-hole and surface mounted sockets are permanently attached to their circuit boards by solder, repair and replacement of such sockets from their circuit boards is a serious problem, usually requiring removal of the circuit board for a time from its system. The socket must be removed by localized or general heating of the circuit board past the melting point of solder. Further cleaning and preparation are then required before a new socket can be installed on the circuit board. Such delays and the accompanying potential for additional damage to expensive circuit boards due to heating makes these types of sockets unsuitable for many applications.

Of the second type of socket, U.S. Pat. No. 5,127,837 to Hopfer et al. entitled "Electrical Connectors and IC Chip Tester Embodying Same" teaches the use of an insulator ring permanently affixed to a printed circuit board wherein the insulator ring is fitted with resilient wadded conductors which provide electrical connection from an integrated circuit package to a circuit board. In this case, the socket is not soldered to the circuit board, but rather is attached by mounting hardware such as screws and is not adapted to be removed from the circuit board without the IC package first being removed from the socket. Thus the socket and IC do not form an integral package.

Similarly, U.S. Pat. No. 4,692,790 to Oyamada entitled "Structure for Connecting Leadless Chip Carrier" teaches a means of aligning an IC package to a printed circuit board and use of an elastomeric interconnect medium. A hinged cover with a spring in its center applies a downward force against the IC package, creating an electrical connection between the IC package and the circuit board. Although the interconnect medium and the IC package can be replaced, there are no provisions for removing the entire socket from the circuit board. Other sockets suffer from the same drawbacks. See, e.g., U.S. Pat. No. 5,100,332 to Egawa entitled "IC Socket" and U.S. Pat. No. 4,954,088 to Tsutomu et al. entitled "Socket for Mounting an IC Chip Package on a Printed Circuit Board".

U.S. Pat. No. 5,161,983 to Ohno et al. entitled "Low Profile Socket Connector" teaches attaching a sheet of elastomer to a molded plastic base by means of plastic pegs. Several problems are presented by such a structure. Elastomers as described are prone to tearing, particularly at stress concentrations such as those applied when stretching elastomers over pegs. Further, elastomers typically require low pressures to engage electrically two opposing point contacts. Localized deformation of the elastomer—typically a low-to-medium durometer silicon rubber—enable such low contact force engagements. Over larger areas, such as those found across land-grid array ("LGA") packages, there is no localized deformation of the elastomer. In such cases the bulk elastomer material must be compressed, requiring significantly higher forces to engage electrically the contacts on either side of the elastomer. Although this patent teaches contact on LGAs with three rows of contacts on each of the four sides of the LGA's bottom surface, substantial force would need to be applied to the LGA to compress the bulk elastomer material enough to create electrical connection between the LGA and the circuit board given the clamping mechanisms described.

Accordingly, there is a need for a demountable IC socket with high pin density.

BRIEF DESCRIPTION OF THE INVENTION

In accordance with the present invention, a demountable socket for a high pin density integrated circuit chip is provided which, together with the IC chip forms an integrated structure. The chip is permanently mounted to a ceramic carrier or "spreader", the spreader is, in turn, compressively held against a first array of compliant or conformal button-type contacts which are, in turn, electrically connected to a second array of conformal contacts on the outside of the socket which are adapted to contact a land-grid array on a printed circuit board or similar structure. The socket is adapted to be easily and rapidly mounted to and demounted from the circuit board with simple hand tools. The IC chip need never be removed from the socket in order to affect mounting and demounting. Shock and contamination protection for the chip is provided by the socket which is adapted to be hand held without significant risk of damage to the chip.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons. The integrated circuit packaging technique of the present invention is now described in further detail with reference to the drawings which illustrate various embodiments within the scope of the invention.

Figure 1:
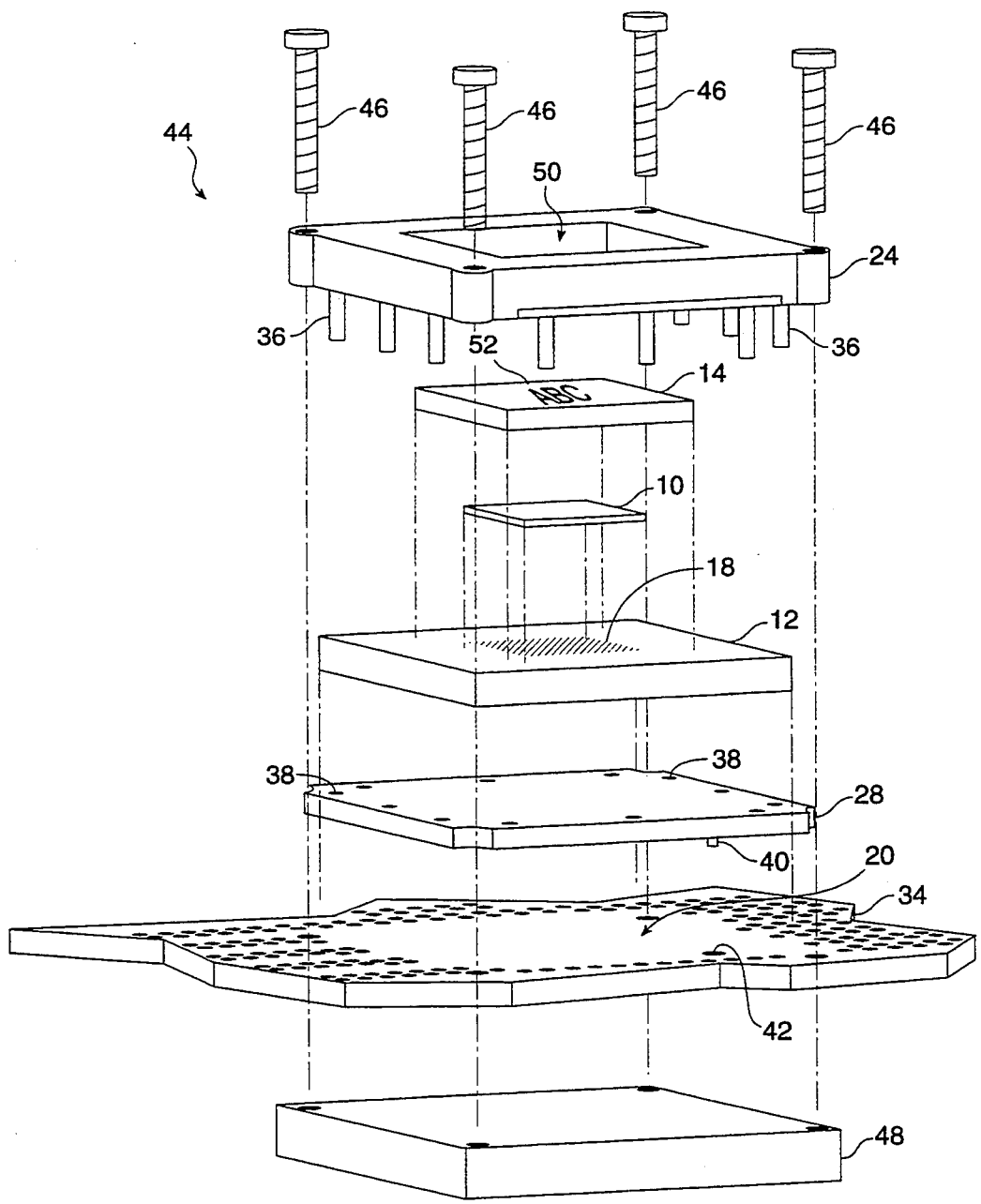
FIG. 1 is an exploded perspective view of an integrated circuit and socket package according to a presently preferred embodiment of the present invention.
Figure 2:
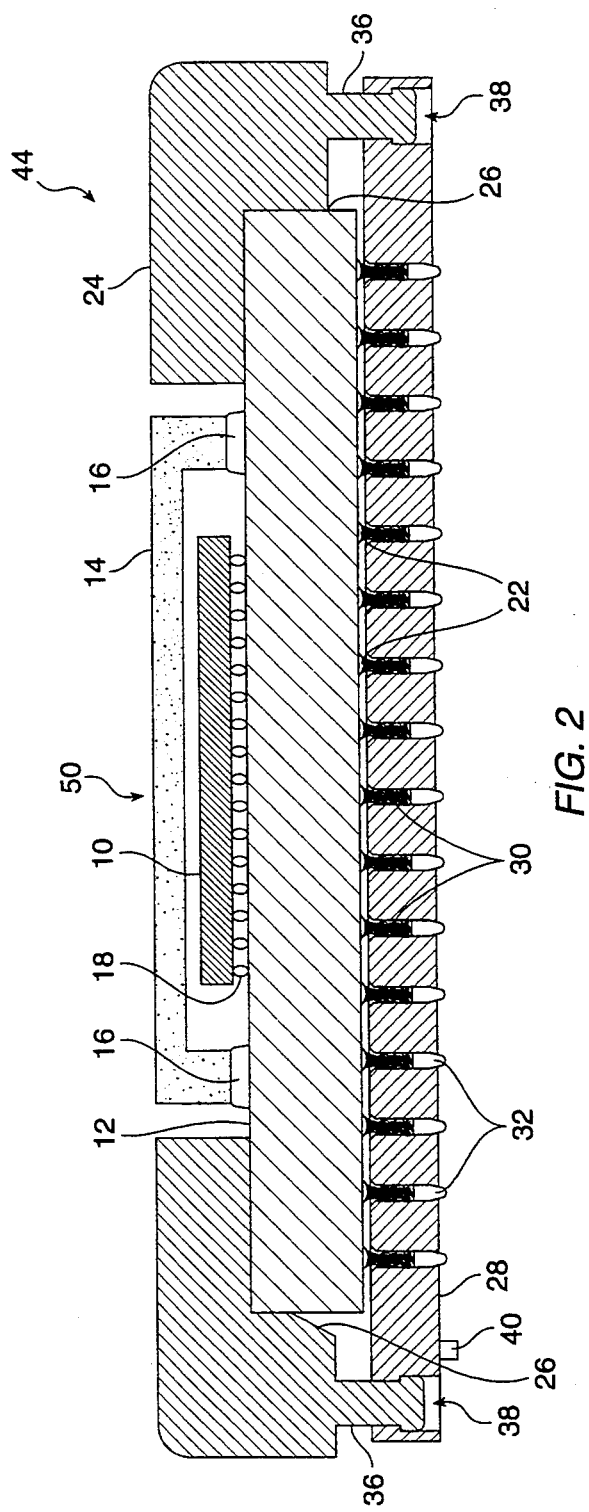
FIG. 2 is a front cross-sectional view of a portion of the assembly shown in FIG. 1.

FIG. 1 illustrates a presently preferred embodiment of the present invention. Referring to FIG. 1, the integrated circuit die 10 is mounted by the solder-bump flip-chip/C4 method onto the upper surface of a multilayer ceramic carrier (or "spreader") 12 as is well known to those of ordinary skill in the art. The ceramic material used in the fabrication of spreader 12 is preferably 90% alumina and 10% glass available from Kyocera Corporation of San Jose, Cal. Spreader 12 need not be fabricated from a ceramic material. Any of a variety of materials used in the fabrication of chip carriers and printed circuit boards may be used, such as FR4, bis-maleimide triazine ("BT"), polyimide, etc. as is well known in the art.

The solder-bump flip-chip/C4 process for connecting die 10 to its substrate or carrier 12 provides the highest available density of interconnects, but is not required by the present invention. The interconnections can also be achieved by wire bonding, tape automated bonding ("TAB"), elastomeric interconnect, or any of a variety of methods that are well known to those of skill in the art.

A shell or cap 14 fabricated from a ceramic or plastic material with B-stage epoxy 16 pre-attached by the supplier is affixed to spreader 12 above die 10. Cap 14 protects the delicate die 10. Such caps are readily available from a number of suppliers, such as Kyocera Corporation of San Jose, Cal. (Part Number KA0523B w/NC0-1505). Those of skill in the art will recognize that there are numerous other methods of protecting the interconnects and the integrated circuit, such as B-stage epoxies ("glob tops") as are frequently used to protect chips mounted directly to printed circuit boards.

Spreader 12 in the presently preferred embodiment is comprised of multiple layers, 21 in the presently preferred embodiment. These layers are themselves comprised of ceramic with metal lines deposited on their surfaces. Vias are used to form connections between layers. The metal lines spread the array of contacts 18 from a pitch of 0.0165" at the upper surface of spreader 12 where die 10 is attached to a pitch of 0.040" at the lower surface of spreader 12 which is also the pitch of the circuit board pads or land-grid array 20 to which the socket 44 is to be attached. Although design and manufacture of multi-layered ceramic carriers is well known in the art, the substrate material need not be ceramic, as discussed above, nor must the metal lines be deposited—they may be etched into metal clad substrate materials rather than deposited. The bottom surface of spreader 12 has an array of contacts 22. In the presently preferred embodiment, contacts 22 are bumps or lands deposited on the bottom surface of spreader 12 through electroless processes as is well known in the art. The outermost metalizaton is gold, although other noble metals may be used. The core of contacts 22 can be any conductor such as copper, nickel, tungsten, or, as presently preferred, molybdenummanganese. Those knowledgeable in the art will realize that there are many alternatives to bump metalizations which could be used herein.

Spreader 12 is placed in a molded plastic socket cover 24. Although cover 24 must be dimensionally stable over the normal operating temperature of the device for which it was designed, there are few materials restrictions. Any of a variety of moldable or machinable plastics can be used with Ryton TM available from Phillips 66 Company of Bartlesville, Okla. presently preferred. Alternatively, metal may be used if heat dissipation from the substrate 12 is required.

Spreader 12 is held in place and registered to the next level of interconnect by expansion of the side walls 26 of socket cover 24. Alternatively, co-molded beam springs or shaped metal springs may be used to locate spreader 12 within socket cover 24. Depending upon the dimensional accuracy of spreader 12 and the next level of interconnect, more or less rigorous alignment methods can be used.

The next level of interconnect may be selected from any number of types of compliant or conformal connectors. The presently preferred embodiment utilizes a molded plastic insulator or "socket base" 28 comprising an array of apertures set at a pitch of 0.040" and fitted with wadded wire contacts or "buttons" 30 and bullet shaped plunger contacts or "plungers" 32 as available from Cinch Connectors of Elk Grove Village, Ill. The buttons 30 are preferably fabricated of 0.001" diameter gold wire formed into a cotton-like material and protrude upward from the array of apertures in socket base 28 by approximately 0.006"; the plungers 32 are preferably fabricated from gold plated brass and are bullet shaped and protrude downward from the array of apertures in socket base 28 by approximately 0.006". Thus socket base 28 with contacts 30 and 32 can compensate for significant non-planarities of both the spreader 12 and the circuit board 34 to which the assembly 44 is mounted. The present invention is not limited to the use of wadded wire/plunger technology. There are numerous suppliers of directionally conductive materials that may be used instead of the wadded wire/plunger approach described herein. Fujipoly, Inc. of Cranford, N.J. supplies silicone rubber sheets with fine wires oriented to conduct only along the material's thickness (z-axis) (Part Number 06-10099A, for example). Other technologies such as ISOCON∩ available from Rogers Corporation of Rogers, Conn. utilize conductive spring members suspended in closed-cell neoprene or silicone carriers. Any of a variety of such uni-directional connectors may be used.

The presently preferred cover 24 is molded with multiple posts 36 along its periphery. These posts 36 fit into shaped holes or apertures 38 in base 28 to form a plastic rivet attachment means. In order to affix cover 24 to base 28 one pushes base 28 against spreader 12 and pushes against the ends of posts 36. This causes the plastic posts to deform, locking the posts 36, and therefore the entire assembly, in place. There are numerous other permanent methods of attaching cover 24 to base 28, such as metal or plastic rivets, spot welding, or adhesive (glue). Although the assembly of the cover 24 to base 28 in the presently preferred embodiment is permanent, there are a number of non-permanent methods available for removably attaching base 28 and cover 24 together, if desirable. Threaded fasteners, thermoplastics and spring clips could be used for this.

Posts 40 on the bottom surface of base 28 are adapted to fit into corresponding holes or apertures 42 in the circuit board 34 in the presently preferred embodiment. This provides alignment of the socket assembly 44 to the printed circuit board 34. Although posts 40 are part of base 28, metal pins could also be used, whether co-molded with the base 28 or added after molding. Similarly, pins can be fitted in the printed circuit board which are adapted to align and mate with holes in the base 28. If the alignment of base 28 to printed circuit board 34 is not critical, alignment pegs 40 and alignment holes 42 may be omitted. Alignment can then be achieved with the placement of screws 46 through cover 24 and circuit board 34, finally tightening in support or backing plate 48, or even another socket assembly 44 on the opposite side of the circuit board.

Force must be applied to buttons 30 by spreader 12 in order to make a reliable electrical connection between the two pieces 12, 28. The assembly of cover 24 to base 28 pushes base 28—and therefore buttons 30—against contacts 22 on spreader 12. Force must also be applied by plungers 32 against contact pads 20 on printed circuit board 34 in order to make reliable electrical connection between the two pieces 28, 34. Screws 46, passing through the corners of cover 24 and printed circuit board 34 are adapted to screw into a support plate 48. The support plate 48 may be made of any suitably rigid material that can hold threads. This system squeezes circuit board 34 between support plate 48 and socket base 28. The normal force needed to ensure adequate contact between plungers 32 and circuit board 34 is typically about 1 to 3 ounces per contact. The presently preferred embodiment utilizes standard #2-56 stainless steel screws. The torque applied to each screw is preferably 8–12 inch-ounces. If circuit board non-planarities are severe, larger screws or higher torque may be used. If the board is sufficiently rigid, nuts may be used instead of support plate 48. Those knowledgeable in the art will realize that there are other methods of mounting the socket assembly 44 to circuit board 34 that do not use screws (e.g., bolts), and that the screws and required torque are unique to the presently preferred embodiment.

Figure 3:
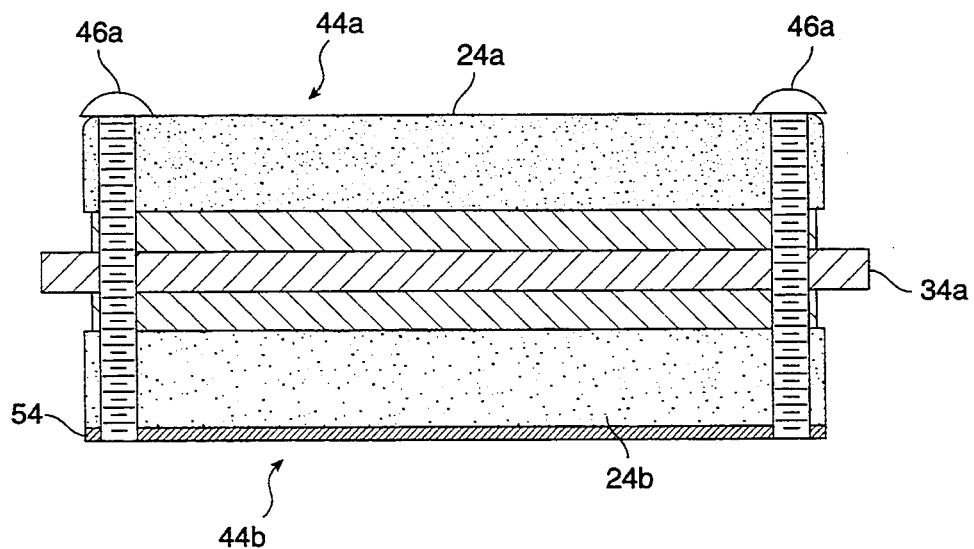
FIG. 3 is a front cross-sectional view of a portion of another embodiment of the present invention.

To conserve board space or to provide unique electrical functions, it is possible to mount socket assemblies on both sides of the circuit board. Such an arrangement is depicted in FIG. 3 a pair of socket assemblies 44a and 44b are shown attached to opposite sides of circuit board 34a with screws 46a. As shown, screws 46a pass through the cover 24a of the top socket assembly 44a, through the circuit board 34a, through the cover 24b the bottom socket assembly 44b, and fasten to a support ring or plate, or a nut. In FIG 3, support plate 54 is threaded to receive screws 46a.

According to a presently preferred embodiment of the present invention socket cover 24 is provided with a large square aperture 50 therethrough and cap 14 may be provided with printing 52 which is visible through aperture 50. In this manner, chip identification information, for example, may be printed on cap 14 and seen through socket cover 24, obviating the need to print chip identifying information on socket cover 24.

While embodiments and applications of this invention have been shown and described, it would be apparent to those skilled in the art that many more modifications than mentioned above are possible without departing from the inventive concepts detailed herein. The invention, therefore, is not to be restricted except in the spirit of the appended claims.

What is claimed is:

1. A reusable, self-contained integrated circuit die package for demountable attachment to a printed circuit board or like device comprising:

a spreader having a first surface and a second surface, said first surface including a first array of electrical contacts bounded by a first area, said electrical contacts adapted to be permanently bonded and electrically connected to at least one integrated circuit die, said second surface including a second array of electrical contacts bounded by a second area larger than said first area;

a socket base having a first surface and a second surface and a first array of conformal electrical contacts extending through and beyond said first surface of said socket base and adapted to make electrical contact with the contacts of said second array of electrical contacts, said first array of conformal electrical contacts in electrical contact with a second array of non-deformable conformal electrically conductive plungers extending through and beyond said second surface of said socket base and adapted to electrically contact electrically conductive pads on the printed circuit board;

a socket cover attached to said socket base by compressive attachment means for applying a compressive force urging said spreader against said first conformal contacts; and means located only at a periphery of the package for removably attaching the package to a circuit board by applying a compressive force urging all portions of the package toward said circuit board.

2. A package according to claim 1 further comprising a cap disposed about said integrated circuit die.

3. A package according to claim 4 wherein said cap has a surface including printing thereon and said socket cover has an aperture therethrough permitting said printing to be viewed from without the package.

4. A package according to claim 1 wherein said first array of electrical contacts has a contact density of at least 2000 contacts per square inch.

5. A package according to claim 1 wherein said first array of electrical contacts has a contact density of at least 3000 contacts per square inch.

6. A package according to claim 1 wherein said second array of electrical contacts has a contact density of at least 500 contacts per square inch.

7. A reuseable, self-contained integrated circuit die package for demountable attachment to a printed circuit board or like device comprising:
   at least one integrated circuit die;
   a spreader having a first surface and a second surface;
   a first land-grid array bounded by a first area on said first surface of said spreader, said integrated circuit die permanently bonded to and electrically connected to said first land-grid array;
   a second land-grid array on said second surface of said spreader, said second land-grid array bounded by a second area greater than said first area;
   a cap bonded to said first surface of said spreader and covering said integrated circuit die;
   a socket base having a first and a second surface and having an array of interstices therethrough;
   a plurality of first conformal contacts inserted into said interstices and extending through and beyond said first surface of said socket base, said first conformal contacts in electrical contact with the elements of said second land-grid array;
   a plurality of second conformal contacts inserted into said interstices and extending through and beyond said second surface of said socket base, said second conformal contacts comprising electrically conductive non-deformable plungers in electrical contact with said first conformal contacts and adapted to make removable electrical contact with contact pads of the circuit board;
   a socket cover attached to said socket base by compressive attachment means for applying a compressive force urging said spreader against said first conformal contacts; and
   means located only at a periphery of the package for removably attaching the package to a circuit board by applying a compressive force urging all portions of the package toward said circuit board.

8. A circuit board and component assembly comprising:
   a first side;
   a second side;
   a first pad array of circuit board pads disposed in an array bounded by a first area on said first side;
   a second pad array of circuit board pads disposed in an array bounded by a second area on said second side, said first area equal to said second area; and
   a first and second reusable integrated circuit die package for demountable attachment to the printed circuit board, said first package mounted to said first side and said second package mounted to said second side, each of said packages including:
   at least one integrated circuit die;
   a spreader having a first surface and a second surface;
   a first land-grid array bounded by a first area on said first surface of said spreader, said integrated circuit die permanently bonded to and electrically connected to said first land-grid array;
   a second land-grid array on said second surface of said spreader, said second land-grid array bounded by a second area greater than said first area;
   a cap bonded to said first surface of said spreader and covering said integrated circuit die;
   a socket base having a first and a second surface and having an array of interstices therethrough;
   a plurality of first conformal contacts inserted into said interstices and extending through and beyond said first surface of said socket base, said first conformal contacts in electrical contact with the elements of said second land-grid array;
   a plurality of second conformal contacts inserted into said interstices and extending through and; beyond said second surface of said socket base, said second conformal contacts comprising electrically conductive non-deformable plungers in electrical contact with said first conformal contacts and in removable electrical contact with pads of the circuit board;
   a socket over attached to said socket base by compressive attachment means for applying a compressive force urging said spreader against said first conformal contacts; and
   means located only at a periphery of said package removably attaching said package to the circuit board by applying a compressive force urging all portions of said package toward the circuit board.

* * * * *

UNITED STATES PATENT AND TRADEMARK OFFICE
CERTIFICATE OF CORRECTION

PATENT NO.  :  5,413,489
DATED       :  May 9, 1995
INVENTOR(S) :  Andrew Switky It is certified that error appears in the above-indentified patent and that said Letters Patent is hereby corrected as shown below:

On column 5, line 11, replace "ISOCON⌒" with --ISOCON™--.

On column 6, line 14, insert "of" after "24b".

On column 8, line 34, replace "and;" with --and--.

On column 8, line 41, replace "over" with --cover--.

Signed and Sealed this

Sixteenth Day of July, 1996

Attest:

BRUCE LEHMAN

*Attesting Officer*   *Commissioner of Patents and Trademarks*